(12) United States Patent
Roth et al.

(10) Patent No.: US 7,168,032 B2
(45) Date of Patent: Jan. 23, 2007

(54) DATA SYNCHRONIZATION FOR A TEST ACCESS PORT

(75) Inventors: Charles P. Roth, Austin, TX (US); Ravi P. Singh, Austin, TX (US); Ravi Kolagotla, Austin, TX (US); Tien Dinh, Cedar Park, TX (US)

(73) Assignees: Intel Corporation, Santa Clara, CA (US); Analog Devices, Inc., Norwood, MA (US)

( * ) Notice: Subject to any disclaimer, the term of this patent is extended or adjusted under 35 U.S.C. 154(b) by 926 days.

(21) Appl. No.: 09/738,405

(22) Filed: Dec. 15, 2000

(65) Prior Publication Data

US 2002/0078420 A1 Jun. 20, 2002

(51) Int. Cl.
*G06F 11/00* (2006.01)

(52) U.S. Cl. .................. 714/798; 713/500; 327/153; 370/416

(58) Field of Classification Search ............ 713/500; 370/416, 422; 714/798, 724, 814, 731, 733, 714/726, 744; 327/141–145, 149, 153
See application file for complete search history.

(56) References Cited

U.S. PATENT DOCUMENTS

| | | | |
|---|---|---|---|
| 5,602,878 A | 2/1997 | Cross | |
| 5,838,684 A * | 11/1998 | Wicki et al. | ............ 370/416 |
| 5,900,753 A | 5/1999 | Cote et al. | |
| 5,935,266 A | 8/1999 | Thurnhofer et al. | |
| 5,983,379 A | 11/1999 | Warren | |
| 6,014,752 A | 1/2000 | Hao et al. | |
| 6,032,271 A | 2/2000 | Goodrum et al. | |
| 6,041,378 A | 3/2000 | Warren | |
| 6,041,418 A | 3/2000 | Chen et al. | |
| 6,052,808 A | 4/2000 | Wu et al. | |
| 6,058,255 A | 5/2000 | Jordan | |
| 6,088,822 A | 7/2000 | Warren | |
| 6,112,298 A | 8/2000 | Deao et al. | |
| 6,115,763 A | 9/2000 | Douskey et al. | |
| 6,145,100 A | 11/2000 | Madduri | |
| 6,321,329 B1 | 11/2001 | Jaggar et al. | |
| 6,754,840 B1 * | 6/2004 | Poisner | ............ 713/500 |

FOREIGN PATENT DOCUMENTS

| | | |
|---|---|---|
| JP | 63-142437 | 6/1988 |
| JP | 10-116208 | 5/1998 |
| JP | 2000-194438 | 7/2000 |
| JP | 2000-330826 | 11/2000 |

OTHER PUBLICATIONS

Tietze/Schenk: "Halbleiter–Schaltungstechnik", 1999, p. 709.

* cited by examiner

*Primary Examiner*—Guy J. Lamarre
(74) *Attorney, Agent, or Firm*—Fish & Richardson P.C.

(57) ABSTRACT

In one embodiment, an integrated circuit provides a test access port that communicates with scan chain registers in a processor core. The integrated circuit synchronizes data transferred between a debug controller that operates under control of a test clock (TCK) and the processor core that operates under control of a processor clock (CLK).

23 Claims, 7 Drawing Sheets

DATA SYNCHRONIZATION FOR A TEST ACCESS PORT

BACKGROUND

This invention relates to transfer of data between an integrated circuit device and a test access port for testing purposes.

Complex integrated circuit devices often include a boundary scan architecture to aid in testing and debugging the device. The boundary scan architecture incorporates a chain of registers coupled to input (I/O) pins on the device. A standard interface, known as the Joint Test Action Group (JTAG) interface, specifies a particular test access port for interfacing with the scan architecture. The JTAG test access port, sometimes referred to as the "TAP," facilitates external access to integrated circuit devices. The JTAG interface is defined by IEEE Standard 1149.1 (IEEE Std. 1149.1-1990, published 1990, and entitled "Test Access Port and Boundary-Scan Architecture").

With the JTAG interface, a debug controller can be used to issue boundary scan commands to the test access port for shifting the scan chains into the integrated circuit, thereby initializing the integrated circuit to a known state. In addition, the debug controller may shift data from the scan chains, and provide the data to the test access port. In this manner, application developers can verify proper operation of code developed for the integrated circuit device.

DETAILED DESCRIPTION

Figure 1:
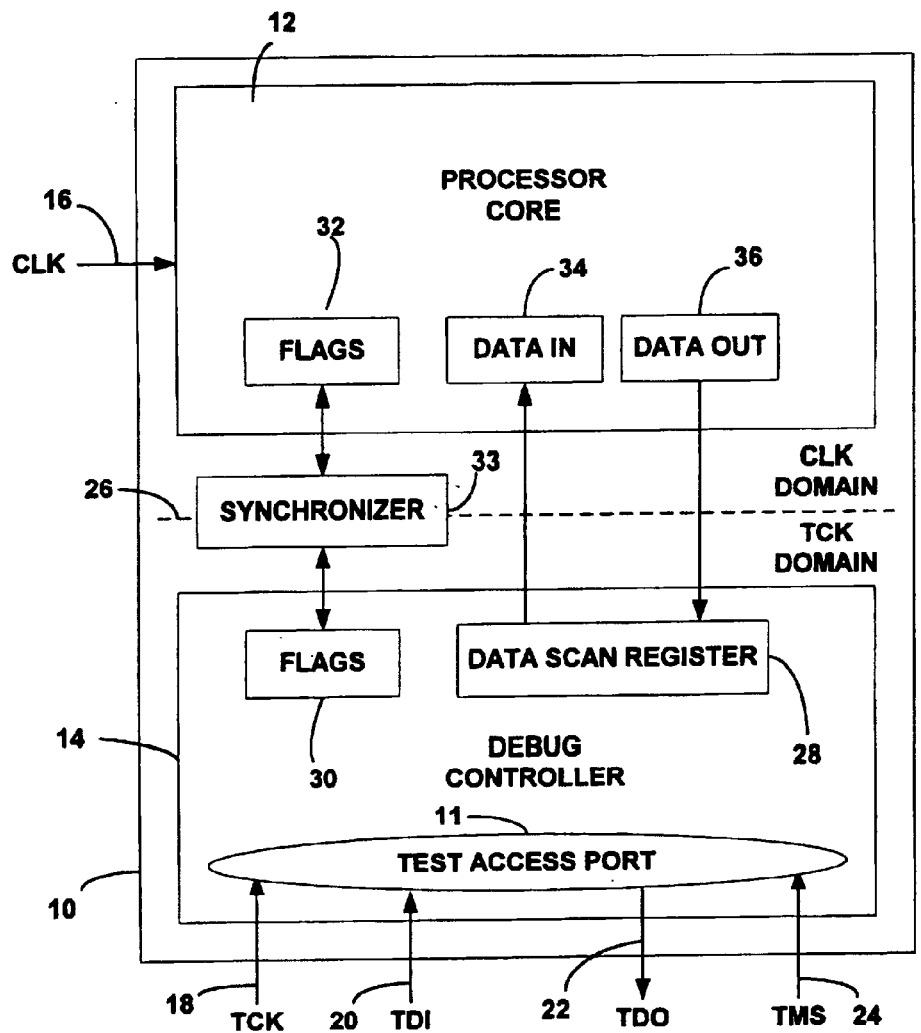
FIG. 1 is a block diagram illustrating an integrated circuit device with a test access port.

FIG. 1 is a block diagram illustrating an integrated circuit device 10 with a test communication port 11 in accordance with an embodiment of the invention. As shown in FIG. 1, integrated circuit device 10 may include a programmable processor core 12 and a debug controller 14. Processor core 12 may execute instructions stored in a random access memory (RAM) device, such as a flash memory device. Processor core 12 operates in a processor clock domain in accordance with a processor clock signal (CLK) at line 16, while debug controller 14 operates in a test clock domain in accordance with a test clock signal (TCK) at line 18.

Debug controller 14 may be equipped with a test access port 11. In particular, test access port 11 may take the form of a JTAG test access port (TAP) having test clock (TCK) line 18, test data input (TDI) line 20, test data output (TDO) line 22, and test mode select (TMS) line 24. Lines 18, 20, 22, 24 form the test access port interface, and may take the form of external pins made accessible by integrated circuit device 10.

In operation, debug controller 14 may receive debug commands in the form of scan chain data from TDI line 20. TDI line 20 may be driven by an external host computer (not shown) such as a PC or workstation that runs a test routine on integrated circuit device 10. In response, debug controller 14 may apply the debug commands to processor core 12. In addition, debug controller 14 extracts state data from processor core 12 to verify processor operation and assist in debugging application code designed for the processor core 12. Debug controller 14 communicates the state data to the remote host computer by placing the extracted data on TDO line 22.

As described above, processor core 12 and debug controller 14 operate in two different clock domains, the test clock domain (TCK) and the processor clock domain (CLK). Line 26 depicts a TCK-CLK clock domain boundary 26 between processor core 12 and debug controller 14. Like TDI line 20, the TCK clock signal line 18 may be driven by an external host computer and may be operating at a relatively low frequency. The CLK clock signal 16, however, may be generated by external or on-board clock circuitry and may operate at a much higher frequency.

Integrated circuit device 10 incorporates a data synchronization feature that permits real-time exchange of data across the two clock domains TCK and CLK, even though the clock domains may be operating at significantly different frequencies. In this manner, data such as test data may be applied and extracted in real time without the need to halt the operation of processor core 12 or buffer data for later analysis. In addition, the data transfer may be accomplished with only a single pass through the JTAG TAP data register states: Capture, Shift, and Update.

The data synchronization feature may allow data exchanged between the TCK and CLK domains to be in a stable state prior to application or extraction of the data. In particular, processor core 12 and debug controller 14 can be adapted to monitor a corresponding set of flags in flag registers 30, 32 that are set and cleared in response to data validation in the respective clock domains. A synchronizer 33, which may take the form of logic and delay circuitry within integrated circuit device 10, controls the setting and clearing of the flags in registers 30, 32.

The flags in registers 30, 32 are used to accommodate different setup times within the clock domains, and provide assurances that data has reached a stable state before the exchange between the disparate clock domains takes place. In particular, the flags are updated to track progress of processor core 12 and debug controller 14 through the Capture, Shift, and Update states, respectively. In this manner, data transfer between the TCK and CLK clock domains can be synchronized. The flags in each clock domain may be substantially identical to one other. For example, each set of flags in registers 30, 32 may include: (1) Data In; (2) Data Out; (3) Data In Overflow; and (4) Data Out Overflow.

A set of data registers may be used in coordination with flag resisters 30, 32 to drive flow of data across the two clock domains CLK and TCK. In particular, a common Data Scan register 28 can be used, on an alternating basis, for the JTAG Capture, Shift, and Update modes, and may take the form of a shift register. A Data In register 34 receives input data from data scan register 28 in the Update mode, permitting the data to be written to processor core 12 on a memory mapped register (MMR) read. A Data Out register 36 receives output data from processor core 12 on an MMR Write, permitting the data to be read by data scan register 28 in the Capture mode, followed by the Shift mode.

Data has been received from the external host computer by the debug controller 14 in the Shift mode. In the Update mode, data is transferred from Data Scan register 28 to Data In register 34. Debug controller 14 sets the Data In flag in flag register 30 to indicate that data has been received from the external host computer. After a predetermined delay generated by synchronizer 33, the Data In flag in flag register 32 is set to indicate that the data has reached a stable state in the CLK domain and can be retrieved by processor core 12 from Data In register 34. Then, on an MMR read, the data from Data In register 34 is written to processor core 12. The Data In flag contained in flag register 32 is cleared upon the MMR read operation, followed by the clearing of the Data In flag in register 30 after a delay set by synchronizer 33.

The Data Out flag in flag register 32 is set by processor core 12, and indicates that data is ready for Capture by debug controller 14 and has reached a stable state. The data is read from processor core 12 on an MMR Write and placed in Data Out register 36. In the Capture Mode, the data from processor core 12 is captured into Data Scan register 28. In response to the setting of the Data Out flag in flag register 32, the Data Out flag in flag register 30 is set following a delay. Debug controller 14 clears the Data Out flag in flag register 30 upon capturing the data into Data Scan register 28. After a delay period, processor core 12 clears the Data Out flag in register 32. In the Shift mode, the data is shifted out to the external host computer.

The Data In Overflow flag is set in flag register 30 when there is an indication of an overflow in the processor clock domain CLK. The Data In Overflow flag is set, for example, in the event the Data In flag in register 32 is not cleared in a specified number of cycles in the TCK clock domain prior to the next Update cycle. In this case, the Data In flag in flag register 30 likewise will not be cleared, signaling a possible overflow event.

Similarly, the Data Out Overflow flag is set in register 32 when there is an indication of an overflow in the debug controller clock domain TCK. The Data Out Overflow flag is set, for example, in the event the Data Out flag is not cleared in register 30 in a specified number of cycles in the CLK clock domain, or is not cleared prior to the next Capture cycle. In this case, the Data Out flag in register 32 likewise will not be cleared.

In operation, processor core 12 and debug controller 14 cycle through the Capture, Shift, and Update states. In the Update state, debug controller 14 generates data for processor core 12. In the Capture state, processor core 12 produces data for extraction by debug controller 14. In effect, debug controller 14 writes data to processor core 12 in the Update state, and extracts resulting state data from the processor core in the Capture state. The Shift state governs transfer of the data into and out of Data Scan register 28.

In the Shift state, pertinent data is shifted into and out of shift register 28 simultaneously. In particular, following the Capture state, shift register 28 shifts in data from debug controller 14 for application to processor core 12. During the Shift state, shift register 28 shifts out data captured from processor core 12 for extraction by debug controller 14.

Figure 2:
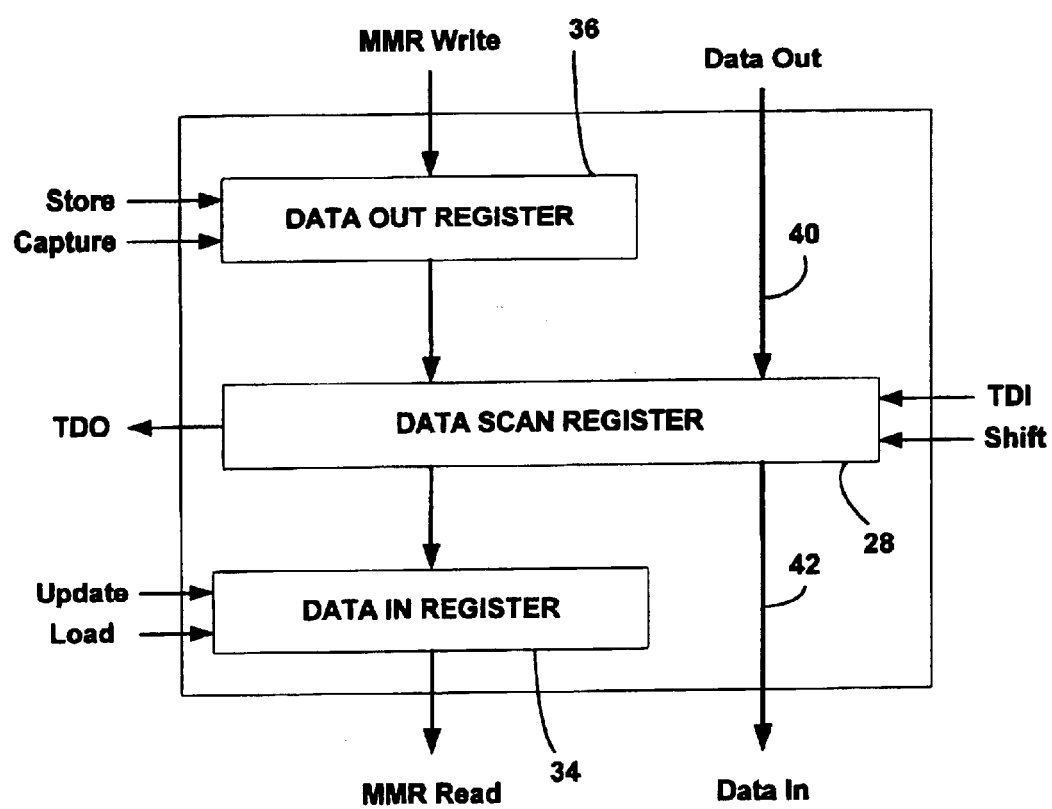
FIG. 2 is a block diagram illustrating circuitry for controlling data flow between a processor core and a test access port in an integrated circuit device.

FIG. 2 is a block diagram illustrating circuitry for controlling data transfer between processor core 12, debug controller 14, and an external host computer. In particular, FIG. 2 illustrates the operations of Data Scan register 28, Data In register 34, and Data Out register 36 of FIG. 1 in greater detail.

Data Scan register 28 may form part of a complex data exchange register, and may be integrated with Data In register 34 and Data Out register 36. Data In register 34 and Data Out register 36 may map to the same memory address and share the same JTAG Data Scan register 28, allowing full-duplex data transfers.

In debug mode, stores from processor core 12 to a memory mapped register are written to Data Out register 36, while loads to processor core 12 from the memory mapped register are read from Data In register 34. Full duplex data transfers can be accomplished by cycling through the Capture, Shift, and Update states.

A Data Outflow bit 40 and Data Inflow bit 42 indicate whether Data Out register 36 and Data In register 34, respectively, are valid. Data Outflow bit 40 is set when a Store to the memory mapped register occurs, and is cleared when a Capture occurs on the Data Scan register 28.

Data Inflow bit 42 is set when an Update occurs simultaneously with the corresponding data bit set in Data Scan register 28. Data Inflow bit 42 is cleared when a Load from the memory mapped register occurs. Data Scan register 28 includes the Data Outflow and Data Inflow flag bits 40, 42. Data Outflow and Data Inflow flag bits 40, 42 can be made part of a separate status register, or duplicated in the Data Scan register 28 to increase the speed of data loading.

With further reference to FIG. 2, Data In register 34 has as inputs an Update control line, a Load control line, and an MMR Read data path to processor core 12. Data Out register 36 has as inputs a Store control line, a Capture control line, and an MMR Write data path from the processor core to Data Out register 36 and Data Scan register 28.

Data Scan register 28 has as inputs the data in (TDI) control line and the Shift control line, and as an output a data out (TDO) line. In operation, the Capture, Shift, Update, and Load commands are synchronized to enable real-time data transfer via Data In register 34, Data Out register 36, and Data Scan register 28.

Figure 3:
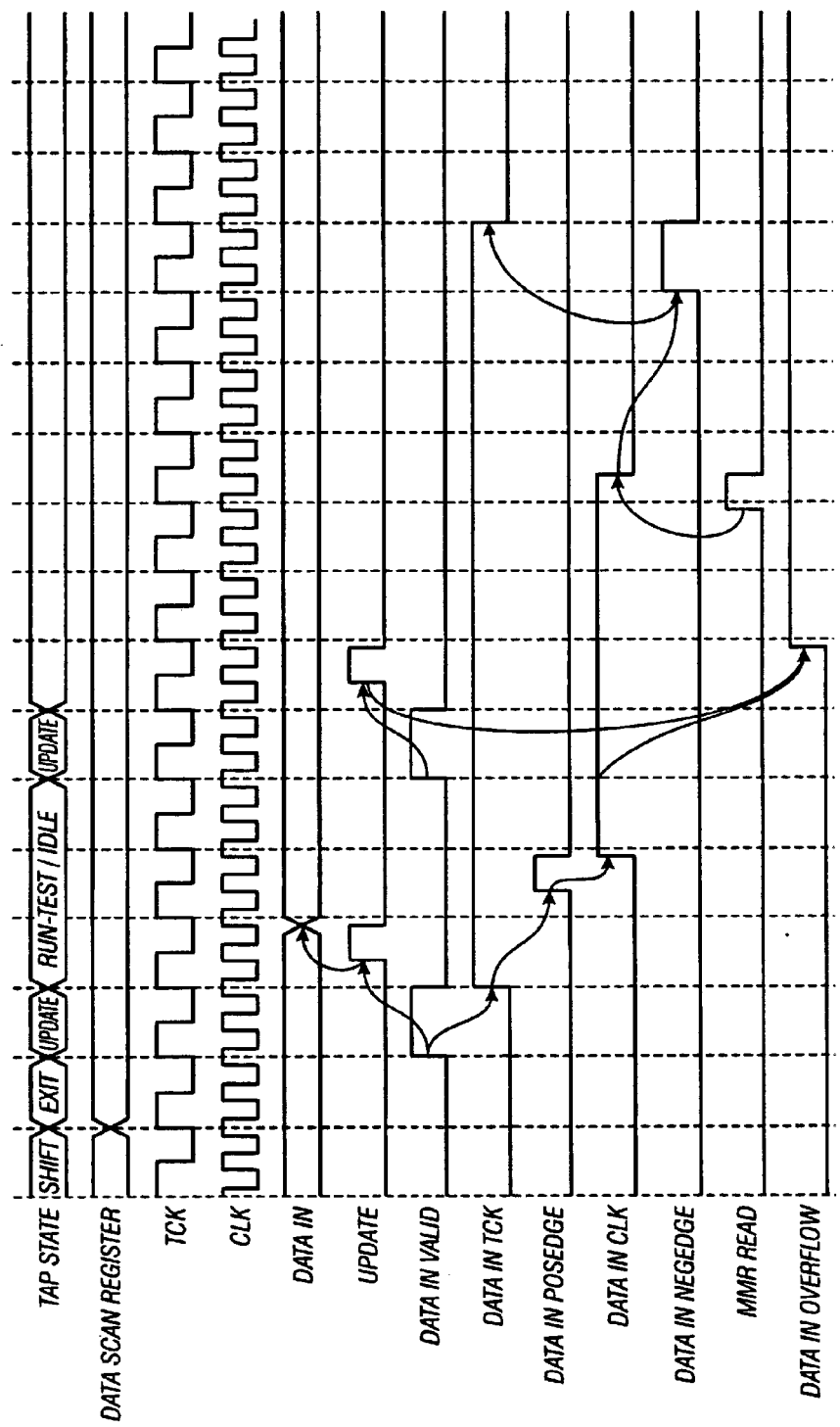
FIG. 3 is a timing diagram illustrating a process for synchronization of real-time data transfer to a processor core from a test access port.

FIG. 3 is a timing diagram illustrating a process for synchronization of real-time data transfer to processor core 12 via test access port 11 in accordance with a particular embodiment of the present invention. FIG. 3 illustrates, in particular, progression of test access port 11 through the Update state in which data is transferred from the debug controller 14 to processor core 12, and shows the interaction of various signals and flags discussed above with reference to FIGS. 1 and 2.

As shown in FIG. 3, scan data is shifted into Data Scan register 28 via the TDI input signal 20 (FIGS. 1–2) on the first positive edge of the TCK clock signal following assertion of the Shift command at the test access port (TAP). At the positive edge of the TCK signal in the Update state, logic circuitry within device 10 asserts a Data In Valid signal, indicating that valid data has been loaded into the shift register 28.

The assertion of the Data In Valid signal within the TCK clock domain causes an Update signal to be asserted in the processor clock CLK domain. The Update signal instructs processor core 12 to load the data in register 34 from Data Scan register 28. If processor core 12 has not finished loading any prior data, an overflow condition arises, as indicated by an assertion of Data In Overflow in flag register 32.

Assuming an overflow condition does not arise, the setting of the Data In flag within flag register 30 is detected and results in the delayed setting of the corresponding Data In flag within flag register 32. More specifically, a Data In Posedge signal is asserted in the CLK domain to indicate a change of state of the Data In flag of flag register 30. The Data In Posedge signal remains asserted for one clock cycle in the CLK domain, and goes low on the next CLK positive edge.

In response to the assertion of the Data In Posedge signal, the Data In flag of flag register 32 is set in the CLK clock domain. As will be discussed below, the Data In flag of flag register 32 remains asserted until the processor core 12 reads the data from the Data In register 34. In this example, four CLK cycles after assertion of the Update signal, the Memory Mapped Register (MMR) Read signal goes high for one CLK cycle indicating that the processor core 12 has read the data from register 34, thereby clearing the Data In flag of flag register 32 on the next CLK cycle. The clearing of the flag is detected, causing a Data In Negedge signal to be asserted in the TCK domain following a pre-determined delay, such as the third TCK cycle following the clearing of the Data In flag of flag register 32 in the CLK domain. The assertion of the Data In Negedge signal causes the Data In flag of flags 30 to be cleared, completing the Update/Load cycle at test access port 11.

Throughout the Update cycle, data is synchronized for real-time transfer using the Data In TCK and Data In CLK flags in registers 30, 32, respectively, and the Data In Overflow flag, allowing processor core 12 to continue its operation. Meanwhile, the Update signal goes high again in response to assertion of the Update command at test access port 11, and stays high for one CLK clock cycle. In response to the Data In CLK flag and assertion of the Update signal, Data In Overflow goes high on the next positive edge of the CLK signal. The Data In Overflow signal indicates that another Update has been initiated but that the Data In CLK flag in flag register 32 has not been cleared.

Figure 4:
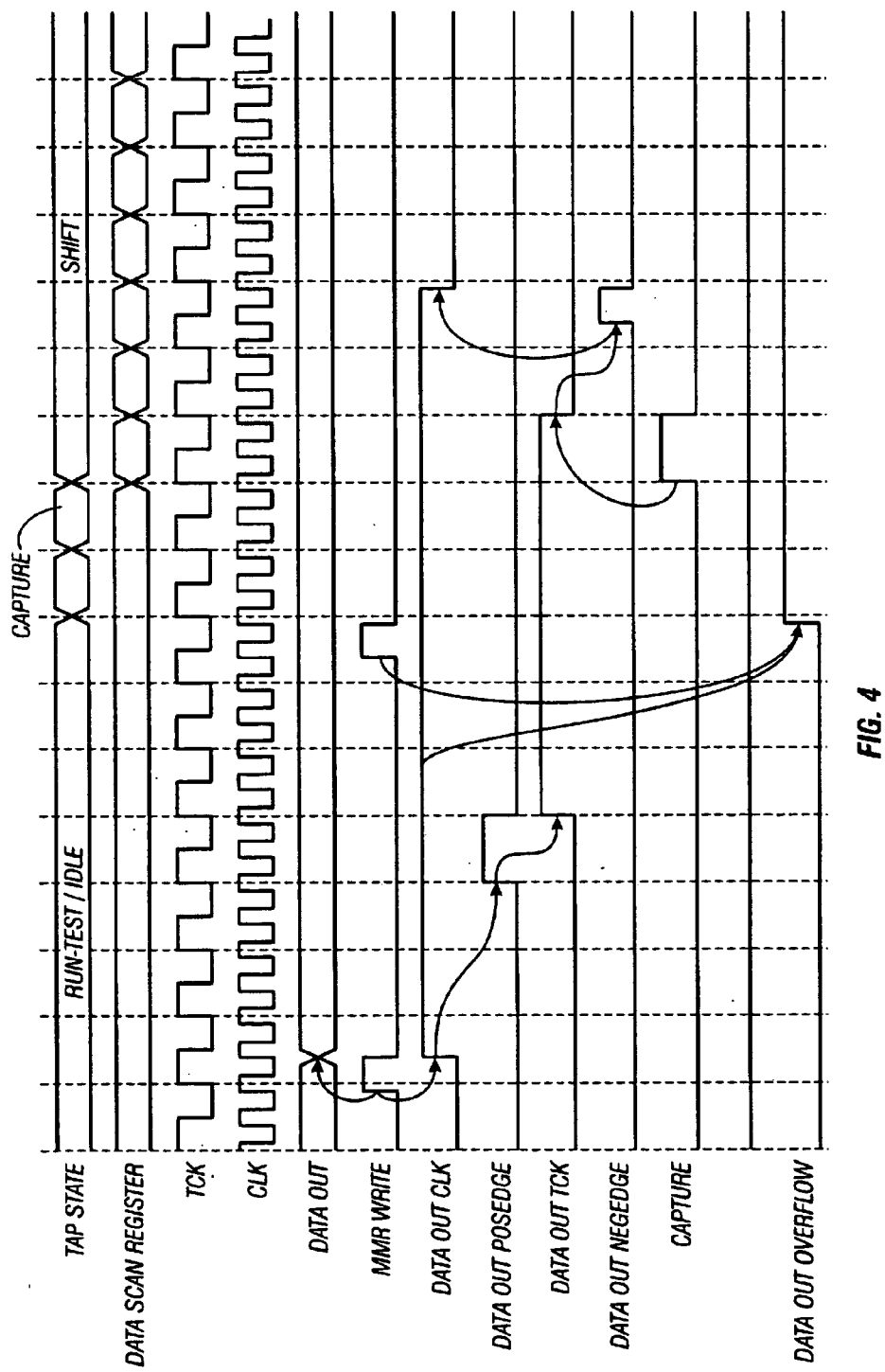
FIG. 4 is a timing diagram illustrating a process for synchronization of real-time data transfer from a processor core to a test access port.

FIG. 4 is a timing diagram illustrating a process for synchronization of real-time data transfer from processor core 12 via test access port 11. Like FIG. 3, FIG. 4 further illustrates the interaction of various signals and flags to carry out data transfer. FIG. 4 illustrates, in particular, progression of test access port (TAP) 11 through the Capture state in which data is transferred from processor core 12 to debug controller 14.

As shown in FIG. 4, an MMR Write signal goes high for one CLK clock cycle. New data is returned into Data Out register 36. In addition, the Data Out CLK flag in flag register 32 is set one CLK cycle following the positive edge of the MMR Write signal. The Data Out CLK flag in flag register 32 indicates that data is stable in the CLK domain. On the third TCK clock cycle following the positive edge of Data Out CLK in flag register 32, the Data Out Posedge signal is asserted. In response to the Data Out Posedge signal, the Data Out TCK flag in flag register 30 is set on the next TCK clock cycle.

If Data Out TCK in flag register 30 is not cleared before the next MMR Write, the Data Out Overflow signal goes high on the negative edge of the MMR Write signal. When the Capture signal is asserted in the TCK domain, data is captured into Data Scan register 28 and shifted out via test access port 11 in the Shift state.

In response to the Capture signal, the Data Out TCK flag in flag register 30 is cleared one TCK cycle later. The Data Out Negedge signal then goes high in the CLK domain on the third CLK cycle following clearing of the Data Out TCK flag, and clears the Data Out CLK flag. In particular, the Data Out CLK flag in flag register 32 is cleared on the next CLK cycle following assertion of the Data Out Negedge signal. The Data Out pin goes high during the period in which Data Out TCK is high.

Figure 5:
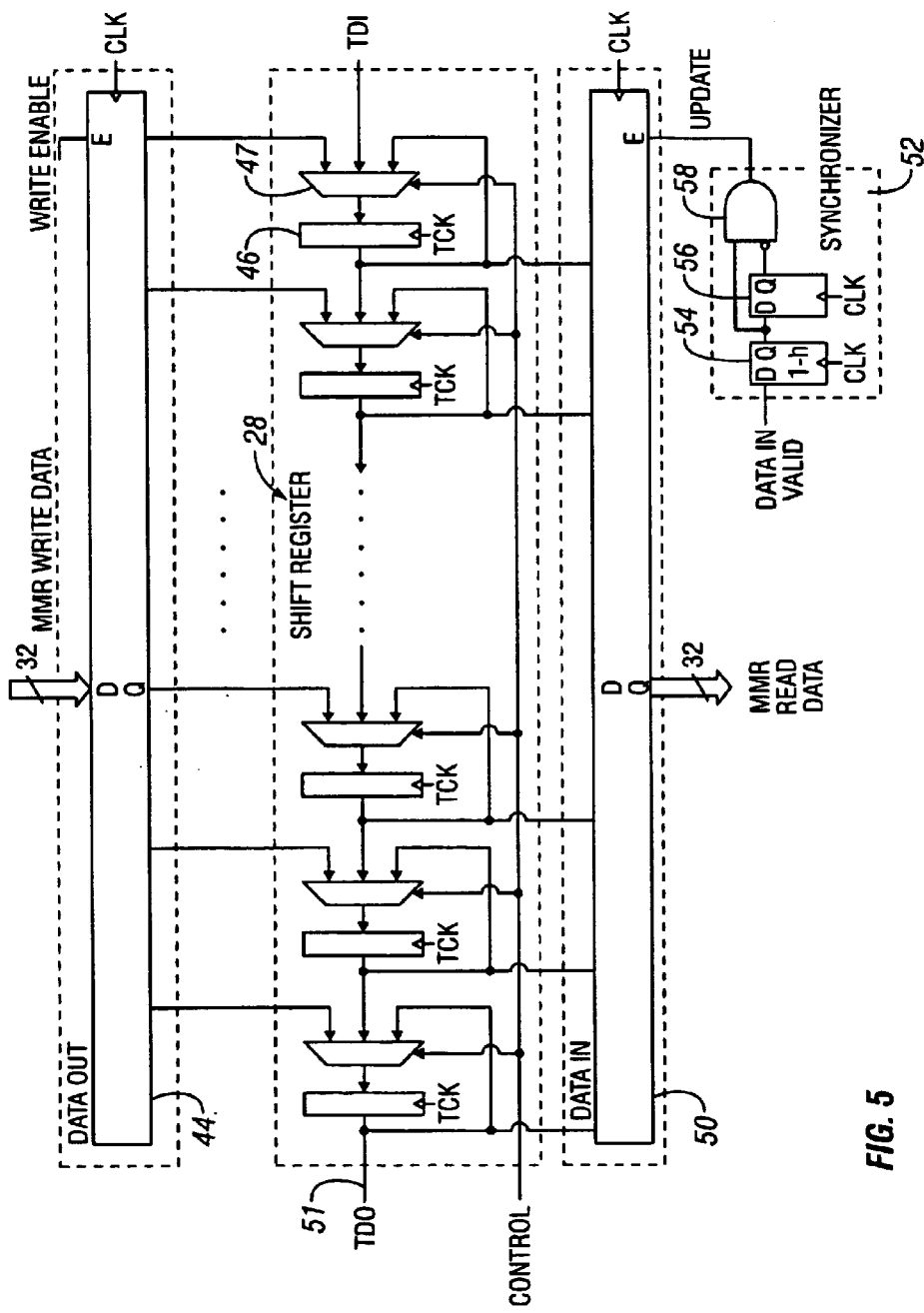
FIG. 5 is a schematic diagram illustrating circuitry for controlling data flow between a processor core and a test access port.

FIG. 5 is a schematic diagram illustrating circuitry for controlling data flow between processor core 12 and test access port 11. For an embodiment in combination with the circuitry of FIGS. 6–9, the circuitry of FIG. 5 serves to synchronize the operation of Data In register 34 and Data Out register 36 and support the interactions described with respect to FIGS. 3 and 4.

As shown in FIG. 5, the circuitry may include a register 44 having as inputs MMR Write Data, which may be 32-bit data received from processor core 12, and an MMR Write Enable line. The output of register 44 provides Data Out in the Capture mode to Data Scan shift register 28. Register 44 is clocked in the processor clock domain CLK, and may form part of Data Out register 36.

A series of multiplexers 47 of Data Scan register 28 receive as inputs Data Out from register 44, TDI from debug controller 14, and a feedback line from a series of output flip flops 46 associated with corresponding multiplexers. Each flip-flop 46 is clocked in the test clock domain TCK. Data Scan shift register 28 is responsive to a control line coupled to each multiplexer 47.

The control line selects one of the inputs of each multiplexer 47 based on the status of certain signals. When a Hold signal is asserted, for example, the feedback line is selected by each multiplexer 47 and output to the associated flip flop 46. In this manner, Data Scan shift register 28 holds its contents. When the Shift signal is asserted, the control line causes each multiplexer 47 to shift in the TDI data, with the last bit of the captured data being shifted out onto the TDO line 51. The output of each flip flop 46 in Data Scan shift register 28 is loaded into a register 50. The output of shift register 28 is a multi-bit bus line, of which one bit is extracted as TDO (indicated at reference numeral 51). Register 50 outputs the data received from flip flops 46 as Data In, and is clocked in the processor clock domain CLK. Register 50 receives at the enable input an Update command from a synchronization circuit indicated by reference numeral 52. In response to the Update command, register 50 clocks through the output of register 28 as MMR Read Data.

Synchronization circuit 52 receives as inputs a Data In Valid signal indicating that there is valid input data in Data Scan shift register 28 for the Update operation. Synchronization circuit 52 may form part of synchronizer 33 in FIG. 1. The Data In Valid signal may propagate through a series of flip-flops 1–n, as indicated by reference numeral 54. The number n of flip-flops 54 can be set according to a desired propagation delay. The propagation delay can be selected to ensure that the data in register 28 has reached a stable state by the time it is clocked into Data In flip-flop 50, thereby synchronizing data transfer across the TCK and CLK clock domains.

The output of flip-flop 54 and flip-flop 56 drive an input and inverted input, respectively, of an AND gate 58. When the Data In Valid signal in the CLK domain indicates valid data in Data Scan shift register 28, flip-flops 54, 56 delay the propagation of the Update command so that Data In flip-flop 50 is not enabled until a period of time afterwards.

In this manner, synchronization circuit 52 ensures the stability of the contents of Data Scan shift register 28, so that the data can be transferred across the CLK-TCK domain interface without substantial risk of data corruption. This process, in effect, synchronizes the data in Data Scan shift register 28 across the TCK and CLK domains to permit real-time transfer without the need to halt the operation of processor core 12. This is a significant advantage that facilitates the code debugging operation.

Figure 6:
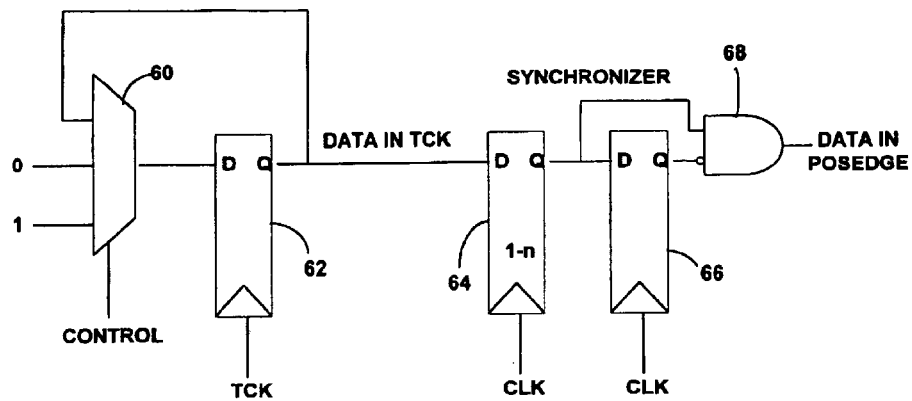
FIG. 6 is another schematic diagram illustrating circuitry for controlling data flow between a processor core and a test access port.

FIG. 6 is another schematic diagram illustrating circuitry for controlling data flow between processor core 12 and debug controller 14. The circuitry of FIG. 6 produces the Data Inflow Posedge signal for synchronization of data and clearing and setting of synchronization flags in the TCK and CLK domains. In particular, the circuitry of FIG. 6 illustrates the relationship between the Data In TCK flag in flag register 30 and the Data In Posedge signal.

As shown in FIG. 6, the circuitry may include a multiplexer 60 that receives as inputs 0, 1, and a feedback line from a flip-flop 62. Flip-flop 62 is clocked in the TCK domain. Multiplexer 60 receives a control line that selects one of the inputs. Upon assertion of the hold signal, the control line controls multiplexer 60 to select the feedback line from flip flop 62.

When a Data In Negedge signal is asserted, the control line causes multiplexer 60 to select the 0 line. When the Update signal is asserted, the control line causes multiplexer 60 to select the 1 line. The output of flip-flop 62 is Data In TCK, which serves as the Data In flag in the TCK domain, i.e., in flag register 30. A series of 1–n flip-flops 64 receives the Data In TCK flag. Flip-flop 66 receives the output of flip-flop 64. Flip-flops 64, 66 are clocked in the CLK domain. The output of flip-flop 64 and flip-flop 66 drive an input and inverted input, respectively, of an AND gate 68. The output of the AND gate 68 is the Data In Posedge signal. The number of flip flops 64 can be selected to provide a propagation delay that ensures stability of inflow data in Data Scan register 28.

Figure 7:
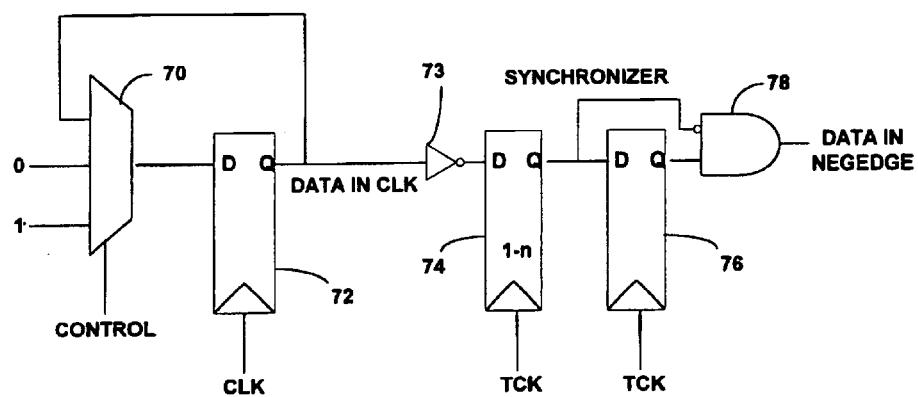
FIG. 7 is another schematic diagram illustrating circuitry for controlling data flow between a processor core and a test access port.

FIG. 7 is another schematic diagram illustrating circuitry for controlling data flow between processor core 12 and debug controller 14. The circuitry of FIG. 7 produces a Data In Negedge signal for synchronization of data in the TCK and CLK domains. In particular, FIG. 7 illustrates the relationship between the Data In CLK flag in flag register 32 and the Data In Negedge signal. As shown in FIG. 7, the circuitry may include a multiplexer 70 that receives as inputs 0, 1, and a feedback line from a flip-flop 72. Flip-flop 72 is clocked in the CLK domain.

Multiplexer 70 receives a control line that drives selection of one of the multiplexer inputs. The feedback line is selected by multiplexer 70 upon assertion of a hold signal. The control line causes multiplexer 70 to select the 0 line when the MMR Read signal and Data In CLK flag are both asserted, i.e., satisfying a logical AND of the two signals. The control line causes multiplexer 70 to select the 1 line when the Data In Posedge signal is asserted. The output of flip-flop 62 is the Data In CLK flag.

A series of 1–n flip-flops 74 receive the Data In CLK flag. Flip-flop 76 receives the output of flip-flop 74. Flip-flops 74, 76 are clocked in the TCK domain, and function as a synchronizer for the Data In CLK flag across the TCK and CLK domains. The output of flip-flops 74 and flip flop 76 drive an input and inverted input, respectively, of an AND gate 78. The output of the AND gate is the Data In Negedge signal.

Figure 8:
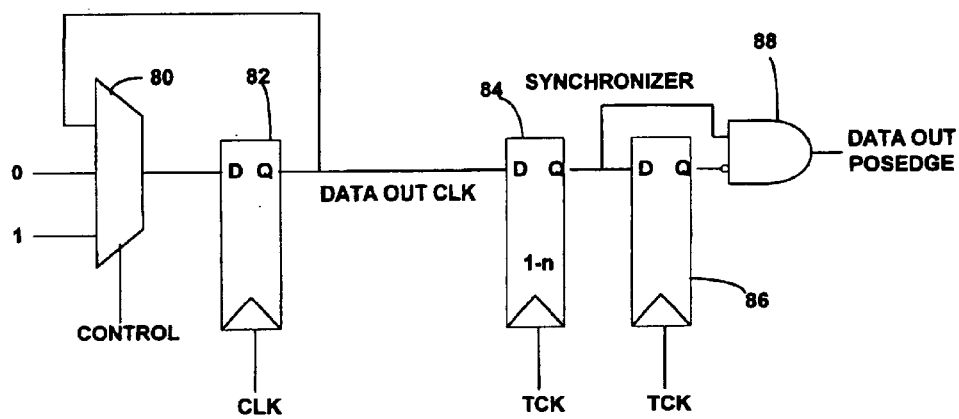
FIG. 8 is another schematic diagram illustrating circuitry for controlling data flow between a processor core and a test access port.

FIG. 8 is another schematic diagram illustrating circuitry for controlling data flow between processor core 12 and test access port 11. The circuitry of FIG. 8 generally conforms to the circuitry of FIG. 6, but relates to the Capture mode. The circuitry of FIG. 8 produces a Data Out Posedge signal for synchronization of data in the TCK and CLK domains.

As shown in FIG. 8, the circuitry may include a multiplexer 80 that receives as inputs 0, 1, and a feedback line from a flip-flop 82. Flip-flop 82 is clocked in the CLK domain. Multiplexer 80 receives a control line that drives selection of one of the inputs. When a hold signal is asserted, the control line drives multiplexer 80 to select the feedback line, Data Out CLK. The control line causes multiplexer 80 to select the 0 line when the Data Out Negedge signal is asserted. When the MMR Write signal is asserted, the control line causes multiplexer 80 to select the 1 line. The output of flip-flop 82 is Data Out CLK, which serves as the Data Out flag in the CLK domain.

A series of 1–n flip-flops 84 receives the Data Out CLK signal. Flip-flop 86 receives the output of flip-flop 84. Flip-flops 84, 86 are clocked in the TCK domain. The output of flip-flop 84 and flip-flop 86 drive an input and inverted input, respectively, of an AND gate 88. The output of the AND gate is the Data Out Posedge signal.

Figure 9:
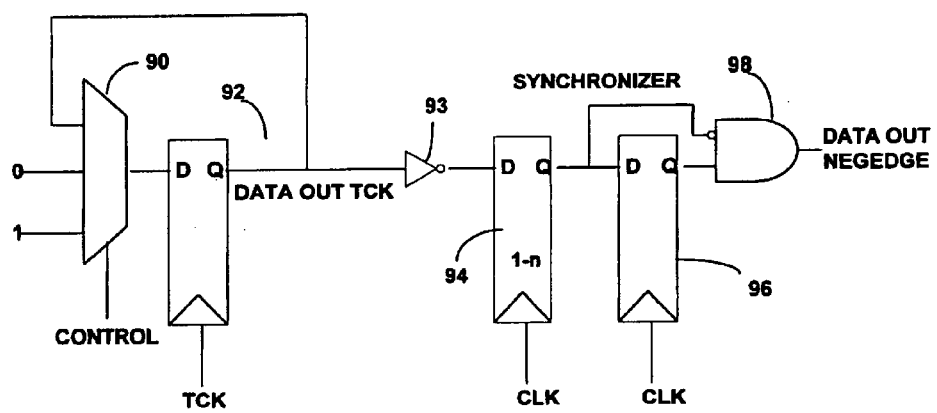
FIG. 9 is another schematic diagram illustrating circuitry for controlling data flow between a processor core and a test access port.

FIG. 9 is another schematic diagram illustrating circuitry for controlling data flow between processor core 12 and test access port 11. The circuitry of FIG. 9 produces a Data Out Negedge signal for synchronization of data in the TCK and CLK domains. As shown in FIG. 9, the circuitry may include a multiplexer 90 that receives as inputs 0, 1, and a feedback line from a flip-flop 92. Flip-flop 62 is clocked in the TCK domain.

Multiplexer 90 receives a control line that drives selection of one of the inputs. The control line causes multiplexer 90 to select the feedback line when a hold signal is asserted. The control line causes multiplexer 90 to select the 0 line when the Capture and Data Out TCK signals are asserted, i.e., in a logical AND. The control line causes multiplexer 90 to select the 1 line when the Data Out Posedge signal is asserted. The output of flip-flop 92 is Data OUT CLK, which serves as the Data Out flag in the CLK domain.

A series of 1–n flip-flops 94 receives the Data In CLK signal. Flip-flop 96 receives the output of flip-flop 94. Flip-flops 94, 96 are clocked in the CLK domain. The output of flip-flop 94 and flip-flop 6 drive an input and inverted input, respectively, of an AND gate 98. The output of the AND gate is the Data Out Negedge signal. The number of flip-flops 94 can be selected to produce a desired propagation delay, and thereby ensure stability of outflow data in Data Scan register 28.

Various embodiments of the invention have been described. These and other embodiments are within the scope of the following claims.

What is claimed is:

1. A method comprising:
   setting a first flag in a test clock domain to indicate availability of data in a first data register in debug controller circuitry;
   responsive to setting the first flag, transferring data from the first data register in the debug controller circuitry to a second data register in processor circuitry in real time without halting an operation of the processor circuitry;
   setting a second flag in a processor clock domain to after a pre-determined delay from setting the first flag to indicate stability of the data in the second data register, the processor clock domain having a different frequency than the test clock domain; and responsive to setting the second flag, reading the data from the second data register in the processor circuitry clocked in the processor clock domain in response to the setting of the second flag.

2. The method of claim 1, further comprising clearing the first and second flags to indicate completion of reading the data from the second data register.

3. The method of claim 2, wherein the first flag is stored in a first flip-flop clocked in the test clock domain, and the second flag is stored in a second flip-flop clocked in the processor clock domain, the method further comprising clearing the first flag in response to clearing of the second flag.

4. The method of claim 1, wherein transferring the data includes transferring scan chain data from the first data register in debug controller circuitry to the second data register in processor circuitry.

5. The method of claim 4, wherein transferring the data includes transferring the data from the debug controller circuitry in the form of a JTAG-compatible test access port (TAP) to the processor circuitry.

6. The method of claim 1, further comprising setting an overflow flag in the event the first flag is not cleared prior to an attempted transfer of additional data from the debug controller circuitry clocked in the test domain to the processor circuitry clocked in the processor domain.

7. The method of claim 1, further comprising:
setting a third flag in the processor clock domain to indicate availability of data in a third data register in the processor circuitry;
responsive to setting the third flag, transferring the data in real time from the third data register in the processor circuitry to the first data register in the debug controller circuitry without halting operation of the processor circuitry;
setting a fourth flag in the debug controller clock domain after a pre-determined delay from setting the third flag to indicate stability of the data in the first data register.

8. The method of claim 1, wherein the debug controller circuitry includes a JTAG-compatible test access port (TAP), the method further comprising transferring the data between the debug controller circuitry and the processor circuitry with a single pass through the JTAG Capture, Shift, and Update data register states.

9. The method of claim 1, further comprising delaying the setting of the second flag with a pre-determined number of flip-flops for a pre-determined number of clock cycles sufficient for the data in the second data register to reach a stable state.

10. An apparatus comprising:
a first data register in debug controller circuitry to operate in a test clock domain;
a second data register in processor circuitry to operate in a processor clock domain, the second data register being operable to receive data from the first data register, the processor clock domain having a different frequency than the test clock domain;
a first flag register to store a first flag in the test clock domain to indicate availability of data in the first data register;
a second flag register to store a second flag in the processor clock domain, the second flag to be set after a pre-determined delay in response to a setting of the first flag to indicate stability of data in the second data register; and
a synchronizer coupled to the first and second flag registers to control the first and second flags and coordinate data transfer between the debug controller circuitry and the processor circuitry in real time without halting operation of the processor circuitry.

11. The apparatus of claim 10, further comprising logic circuitry to clear the first and second flags to indicate completion of the transfer of the data.

12. The apparatus of claim 11, wherein the first flag is to be stored in a first flip-flop clocked in the test clock domain, and the second flag is to be stored in a second flip-flop clocked in the processor clock domain, the apparatus further comprising circuitry to clear the first flag in response to a clearing of the second flag.

13. The apparatus of claim 10, wherein the data includes scan chain data.

14. The apparatus of claim 13, wherein the debug controller circuitry includes a JTAG-compatible test access port (TAP).

15. The apparatus of claim 10, further comprising logic circuitry to set an overflow flag in the event the first flag is not cleared prior to an attempted transfer of additional data between the debug controller circuitry clocked in the test domain and the processor circuitry clocked in the processor domain.

16. The apparatus of claim 10, wherein the debug controller circuitry includes a JTAG-compatible test access port (TAP), and the first flag register, second flag register, first data register and second data register are arranged to transfer the data between the debug controller circuitry and the processor circuitry with a single pass through JTAG Capture, Shift, and Update data register states.

17. The apparatus of claim 10, further comprising delay circuitry to delay the setting of at least one of the first and second flags for a number of clock cycles sufficient for the data to reach a stable state.

18. A system comprising:
a flash memory device;
a processor circuitry coupled to the flash memory device, the processor circuitry to operate in a processor clock domain;
debug controller circuitry coupled to the processor circuitry, the debug controller circuitry to operate in a test clock domain, the test clock domain having a different frequency than the processor clock domain;
a first data register in the debug controller circuitry;
a second data register in the processor circuitry, the second data register being operable to receive data from the first data register;
a first flag register to store a first flag in the test clock domain to indicate availability of data in the first data register;
a second flag register to store a second flag in the processor clock domain, the second flag to be set after a pre-determined delay in response to a setting of the first flag to indicate stability of data the second data register; and
a synchronizer coupled to the first and second flag registers to control the first and second flags and coordinate data transfer between the debug controller circuitry and the processor circuitry in real time without halting operation of the processor circuitry.

19. The system of claim 18, further comprising logic circuitry to clear the first and second flags to indicate completion of the transfer of the data.

20. The system of claim 19, wherein the first flag is to be stored in a first flip-flop clocked in the test clock domain, and the second flag to be stored in a second flip-flop clocked in the processor clock domain, the system further comprising circuitry to clear the first flag in response to clearing of the second flag.

21. The system of claim 18, further comprising logic circuitry to set an overflow flag in the event the first flag is not cleared prior to an attempted transfer of additional data between the debug controller circuitry clocked in the test domain and the processor circuitry clocked in the processor domain.

22. The system of claim 18, wherein the debug controller circuitry includes a JTAG-compatible test access port (TAP), and the first flag register, second flag register, first data register and second data register are arranged to transfer the data between the debug controller circuitry and the processor circuitry with a single pass through JTAG Capture, Shift, and Update data register states.

23. The system of claim 18, further comprising delay circuitry to delay the setting of at least one of the first and second flags for a number of clock cycles sufficient for the data to reach a stable state.

* * * * *